(12) United States Patent
Koyanagi

(10) Patent No.: US 6,803,528 B1
(45) Date of Patent: Oct. 12, 2004

(54) MULTI-LAYER DOUBLE-SIDED WIRING BOARD AND METHOD OF FABRICATING THE SAME

(75) Inventor: Tatsunori Koyanagi, Sagamihara (JP)

(73) Assignee: 3M Innovative Properties Company, St. Paul, MN (US)

( * ) Notice: Subject to any disclaimer, the term of this patent is extended or adjusted under 35 U.S.C. 154(b) by 7 days.

(21) Appl. No.: 10/088,982

(22) PCT Filed: Oct. 31, 2000

(86) PCT No.: PCT/US00/30015
§ 371 (c)(1),
(2), (4) Date: Mar. 26, 2002

(87) PCT Pub. No.: WO01/35704
PCT Pub. Date: May 17, 2001

(30) Foreign Application Priority Data

Nov. 5, 1999 (JP) .............................. 11-315106

(51) Int. Cl.[7] .............................. H05K 1/11; H01R 12/04
(52) U.S. Cl. ..................... 174/262; 174/256; 174/266; 29/846; 29/852
(58) Field of Search ............................... 174/262, 266, 174/264, 261, 255, 265, 256; 361/792, 803; 29/846, 852, 825

(56) References Cited

U.S. PATENT DOCUMENTS

| | | | | |
|---|---|---|---|---|
| 3,471,631 A | * | 10/1969 | Quintana | ..................... 174/264 |
| 4,402,998 A | * | 9/1983 | Kumagai et al. | .............. 427/97 |
| 4,582,564 A | * | 4/1986 | Shanefield et al. | ........... 216/18 |
| 4,642,160 A | * | 2/1987 | Burgess | ........................ 216/18 |
| 5,084,124 A | * | 1/1992 | Taniguchi | .................... 156/315 |
| 5,096,546 A | * | 3/1992 | Kitamura et al. | ........... 205/155 |
| 5,347,712 A | * | 9/1994 | Yasuda et al. | ................. 29/852 |
| 5,366,814 A | * | 11/1994 | Yamanishi et al. | ......... 428/607 |
| 5,576,052 A | * | 11/1996 | Arledge et al. | ............... 427/98 |
| 5,709,957 A | * | 1/1998 | Chiang et al. | .............. 428/615 |
| 5,774,340 A | * | 6/1998 | Chang et al. | ............... 361/771 |
| 6,020,561 A | * | 2/2000 | Ishida et al. | ................ 174/261 |
| 6,119,335 A | * | 9/2000 | Park et al. | ..................... 29/830 |
| 6,353,188 B1 | * | 3/2002 | Fernandez | .................. 174/255 |
| 6,405,431 B1 | * | 6/2002 | Shin et al. | ..................... 29/852 |

FOREIGN PATENT DOCUMENTS

| JP | 05-327224 | 12/1993 |
|---|---|---|
| JP | 05-327229 | 12/1993 |

* cited by examiner

*Primary Examiner*—David A. Zarneke
*Assistant Examiner*—I B Patel
(74) *Attorney, Agent, or Firm*—Melanie G. Gover

(57) ABSTRACT

Disclosed herein are multi-layer double-sided wiring boards having an insulating layer with an opening, conductive layers on both surfaces of the insulating layer and on the inside of the opening, and an interface layer between the insulating layer and portions of the conductive layers wherein the conductive layers are in direct contact in the opening. Also disclosed are methods of fabricating such multi-layer double-sided wiring boards.

5 Claims, 4 Drawing Sheets

MULTI-LAYER DOUBLE-SIDED WIRING BOARD AND METHOD OF FABRICATING THE SAME

DETAILED DESCRIPTION OF THE INVENTION

1. Technical Field of the Invention

The present invention relates to a multi-layer double-sided wiring board having wiring layers formed on both sides of an insulating layer using a two-layer tape technology that forms a conductive layer of copper or the like on an insulating layer of a polyimide film or the like without interposing an adhesive layer therebetween, and also having a blind via interconnecting the wiring layers and closed at one end with the conductive layer. The invention also relates to a method of fabricating such a multi-layer double-sided wiring board.

2. Related Art

A multi-layer double-sided wiring board having wiring layers formed on both sides of an insulating layer using a two-layer tape technology, and also having a blind via interconnecting the wiring layers, is fabricated in accordance with the following process.

First, starting with a two-layer tape comprising a film made of an insulating material such as polyimide and a conductive layer formed by sputtering or plating on the upper surface of the film, an opening whose upper end is closed with the upper conductive layer is formed in the insulating layer by selectively etching the lower surface of the film. At this time, a wiring pattern is formed on the upper surface by an additive process or a subtractive process. Next, a conductive layer is formed by sputtering or plating over the entire lower surface including the inside wall of the opening and the portion of the upper conductor which is exposed in the opening. In this way, the blind via is formed with the upper and lower conductive layers interconnected within the opening in a back-to-back configuration.

In the multi-layer double-sided wiring board fabricated in accordance with the above process, at first a sufficient bonding strength is retained between the polyimide and the copper sputtered thereon, but when heat or stress is applied in a subsequent process, the bonding strength decreases. In view of this, when producing a two-layer tape by forming a conductive layer on the upper surface of a polyimide film, it is practiced to deposit an interface layer containing a dissimilar metal such as Cr, Ni, or the like by sputtering on the film prior to the copper sputtering, thereby increasing the peel strength between the base and lead finished product.

On the other hand, careful consideration is required in joining the upper and lower conductive layers in the blind via, since the size of the joining portion is as small as tens of micrometers, the size tending to decrease with decreasing feature size. Japanese Unexamined Patent Publication No. 5-327224, for example, discloses that when sputtering copper, high-purity copper is used in order to prevent disconnection within the via hole.

According to the present invention, there is provided a multi-layer double-sided wiring board which provides excellent adhesion between the conductive layer and the insulating layer because of the provision of an interface layer therebetween, and which exhibits excellent conductivity reliability because the upper and lower conductive layers are joined together within the blind via without interposing a dissimilar metal.

PROBLEMS TO BE SOLVED BY THE INVENTION

To improve the bonding strength between the insulating layer and the lower conductor, it is also possible to interpose an interface layer between the insulating layer and the lower conductor by sputtering a dissimilar metal prior to the formation of the lower conductor, as is done for the upper conductor described above. In that case, however, since the structure is such that the dissimilar metal is sandwiched between the upper and lower conductive layers (copper) in the blind via, there arises the problem that the reliability of conductivity between the upper and lower circuit sides of the finished circuit board greatly degrades.

In the second method, on the other hand, while measures have been taken to ensure good bonding between the copper patterns based on advanced technological studies, no solution has been provided for the adhesion to the base material.

It is, accordingly, an object of the present invention to provide a multi-layer double-sided wiring board and a method of fabricating the same, wherein the above two problems, i.e., the adhesion between the lower conductive layer and the insulating layer and the reliability of conductivity between the upper and lower conductive layers in the blind via, are solved simultaneously.

SUMMARY OF THE INVENTION

According to the present invention, there is provided a multi-layer double-sided wiring board comprising: an insulating layer having an opening formed therein; a first conductive layer formed on an upper surface of the insulating layer; a second conductive layer formed on a lower surface of the insulating layer and covering an inside wall of the opening and a portion of the first conductive layer which is exposed in the opening; and an interface layer interposed between the insulating layer and the first and second conductive layers, wherein the second conductive layer directly contacts the first conductive layer in the opening without interposing the interface layer therebetween.

The interposition of the interface layer provides good adhesion between the insulating layer and the second conductive layer, and at the same time, conductivity reliability is retained since the first and second conductive layers contact each other in the opening.

Preferably, the second conductive layer directly contacts the insulating layer at the inside wall of the opening without interposing the interface layer therebetween.

In this case, while the adhesion between the second conductive layer and the inside wall of the insulating layer is not sufficient, this portion acts as a stress reliever for the conductive layer and thus serves to secure the conductivity reliability of the conductive layer.

Preferably, the interface layer contains at least one metallic element selected from the group consisting of nickel, cobalt, zinc, and chromium.

Also provided is a method of fabricating a multi-layer double-sided wiring board, comprising the steps of: selectively removing a portion of an insulating layer on an upper surface of which is formed a conductive layer, and thereby forming in the insulating layer an opening whose upper end is closed with the conductive layer; forming an interface layer over an entire lower surface; selectively removing at least a portion of the interface layer which contacts the first conductive layer; and forming a conductive layer over the entire lower surface.

Also provided is a method of fabricating a multi-layer double-sided wiring board, comprising the steps of: forming an opening pattern by selectively removing a portion of a conductive layer formed on a lower surface of an insulating layer with an interface layer interposed therebetween, the insulating layer also having a conductive layer formed on an upper surface thereof with an interface layer interposed therebetween; selectively removing a portion of the insulating layer as well as a portion of the interface layers by using the thus patterned lower conductive layer as a mask, and thereby forming in the insulating layer an opening whose upper end is closed with the upper conductive layer; and forming a conductive layer over the entire lower surface including a side wall of the opening and a portion of the upper conductive layer which is exposed in the opening.

DETAILED DESCRIPTION OF THE INVENTION

FIG. 1 shows a cross section illustrating the vicinity of the blind via 18 in the previously described multi-layer double-sided wiring board in which the interface layer 14 is simply interposed between the insulating layer 10 and the lower conductive layer 12. In this case, the reliability of conductivity significantly degrades because the interface layer 14 of a dissimilar metal is formed interposing between the upper conductive layer 16 and lower conductive layer 12 in the blind via 18 where they are interconnected.

FIG. 2 shows a cross section illustrating the vicinity of a blind via in a multi-layer double-sided wiring board according to a first embodiment of the present invention. Since the interface layer 14 is not formed interposing between the upper conductive layer 16 and lower conductive layer 12 in the blind via 18 where they are interconnected, the reliability of conductivity is retained.

FIG. 3 shows a cross section illustrating the vicinity of a blind via in a multi-layer double-sided wiring board according to a second embodiment of the present invention. As shown, the interposing interface layer 14 is absent not only in the portion of the blind via 18 connecting to the upper conductor 16, but also in the side wall of the via hole. In this case, while the adhesion between the lower conductive layer 12 and the insulating layer 10 in this side wall portion is not sufficient, this portion acts as a stress reliever for the entire structure of the conductive layer and thus serves to secure the conductivity reliability of the conductive layer. Results of reliability evaluation tests conducted on the respective samples are shown in Table 1.

TABLE 1

|  | High Temperature storage (hours) | High Temperature, High Humidity (hours) | PCT (hours) | Temperature cycle (hours) |
|---|---|---|---|---|
| Embodiment 1 | 1000< | 1000< | 300< | 1000< |
| Embodiment 2 | 1000<< | 1000<< | 300<< | 1000<< |
| Prior Art | 250 | 1000 | 192 | 312 |

As can be seen from Table 1, both the first and second embodiments satisfy the required quality, but the second embodiment where the interface layer is not interposed at the side walls of the via hole exhibits a better quality. It will also be noted that the second embodiment is easier to fabricate than the first embodiment.

The thickness of the interface layer is 10 nm to 500 nm, and preferably 150 nm, and the material is a single-element or a composite material containing Co, Ni, Zi, or Cr, and a material containing Cr is particularly preferable. The upper and lower conductive layers are 5 $\mu$m to 50 $\mu$m in thickness, and the material is preferably copper. The thickness of the insulating layer is 10 $\mu$m to 100 $\mu$m, and preferably 50 $\mu$m and polyimide is preferable as the material. Dry plating methods for the conductive layers include sputtering and vapor deposition.

The multi-layer double-sided wiring board having the blind via of the present invention is fabricated, for example, by one of the following two processes. The first process will be described first.

1) An interface layer 20 and a metal layer 22 are formed in this order by dry plating on the upper surface of a polyimide film 10, thus forming a base substrate (FIG. 4(a)).

2) Photoresist layers are formed on both surfaces of the base substrate, and the photoresist layers arm exposed to light through respective photo masks and developed to form resist patterns 24 on both surfaces of the base substrate (FIG. 4(b)).

3) A lead preform is formed by forming a metal layer 16 only on the upper surface of the substrate in the position where the resist pattern does not exist.

4) The portion of the substrate lower surface where the resist pattern does not exist is removed by wet or dry etching to form a polyimide pattern. At the same time, the corresponding portion of the interface layer is also removed by etching.

5) The resist patterns on the upper and lower surfaces of the substrate are removed (FIG. 4(c)).

6) An interface layer 14 and a metal thin-film layer 26 are formed in this order over the entire lower surface of the substrate (FIG. 4(d)).

7) A resist layer is formed on the lower surface of the substrate. (The upper surface is covered by a protective layer (resist).

8) Using a photo mask on the lower surface of the substrate, the resist layer is exposed to light and then developed to form a resist pattern 28 (FIG. 4(e)).

9) The metal layer and interface layer formed on the lower surface of the substrate are etched in the position where the resist pattern does not exist.

10) The lower resist 28 is removed (FIG. 5(a)).

11) A metal layer 30 is formed by sputtering over the entire lower surface without forming an interface layer therebetween. The side wall of the via is thus made electrically conductive (for the subsequent plating step) (FIG. 5(b)).

12) Again, a resist layer is formed on the lower surface of the substrate, and the resist layer is exposed to light through a photo mask and then developed to form a resist pattern (not shown).

13) A lead preform 32 is formed on the lower surface of the substrate in the position where the resist pattern of the resist layer does not exist (FIG. 5(c)).

14) The resist pattern on the lower surface of the substrate is removed, and a lead is formed by etching off the upper and lower surfaces of the substrate in the positions 34 where the lead preforms are not formed (FIG. 5(d)).

15) If necessary, finish plating or solder resist coating is applied.

The second process will be described next.

1) The second process uses as the starting material a polyimide tape coated with copper foil on both sides thereof (FIG. 6(a)). This double-sided copper foil polyimide tape is fabricated by metalizing both surfaces of the polyimide 10 by vacuum evaporation such as sputtering or vaporization, followed by plating to give a certain degree of thickness to the copper foil. When metalizing, interface layers 36 are formed to increase the bonding strength.

2) Photoresist is applied to the double-sided copper foil polyimide tape, and the photoresist is exposed and developed to form a via hole pattern. Using the developed photoresist as a mask, the copper foil on one side of the tape is etched (FIG. 6(*b*)). If necessary, a PI (polyimide) opening pattern may be formed at the same time.

3) Using the thus etched copper foil pattern 38 as a mask, the polyimide layer 110 is etched by a laser or chemical etching (hydrazine, etc.). The copper foil on the opposite side is exposed through the via thus etched (FIG. 6(*c*)).

4) After cleansing (desmearing) the inside of the via, the polyimide inside the via is made electrically conductive. Making the polyimide conductive is accomplished by copper sputtering 40 alone without forming an interface layer (FIG. 6(*d*)). After making the polyimide inside the via electrically conductive, electrolytic copper plating is performed to give the necessary thickness to the copper on the polyimide inside the via.

5) After the copper plating of the via hole, photoresist layers are formed on the upper and lower surfaces of the substrate, and using glass masks on the upper and lower surfaces, the photoresist layers are exposed for development.

6) Lead preforms are formed on the upper and lower surfaces of the substrate in the positions where the resist patterns of the resist layers does not exist.

7) The resist patterns on the upper and lower surfaces of the substrate are removed, and a lead is formed by etching off the upper and lower surfaces of the substrate in the positions where the lead preforms are not formed (FIG. 6(*e*)).

8) If necessary, a PI pattern is formed by photolithography plus chemical etching, die-punching laser processing, etc., which is further followed by finish plating or solder resist coating.

In the first and second processes, the circuit patterning has been described by taking an additive process as an example, but instead, a subtractive process may be used.

DESCRIPTION OF THE REFERENCE NUMERALS

Figure 1:
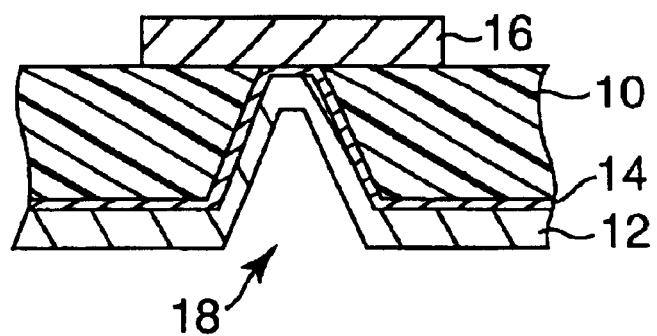
FIG. 1 is a cross-sectional view of a multi-layer double-sided wiring board where an interface layer is formed underlying the lower conductive layer.
Figure 2:
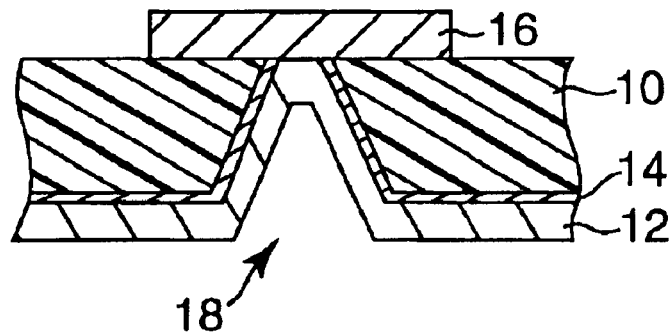
FIG. 2 is a cross-sectional view of a multi-layer double-sided wiring board according to a first embodiment of the present invention.
Figure 3:
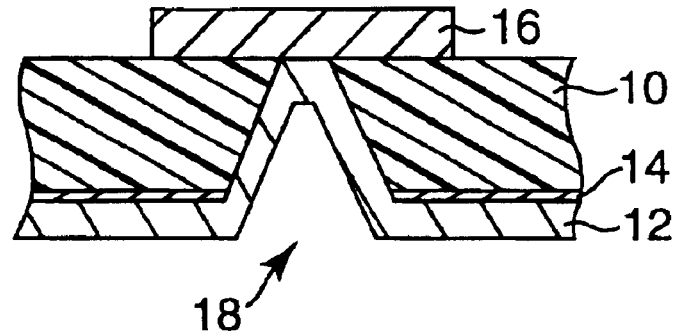
FIG. 3 is a cross-sectional view of a multi-layer double-sided wiring board according to a second embodiment of the present invention.
Figure 4A:
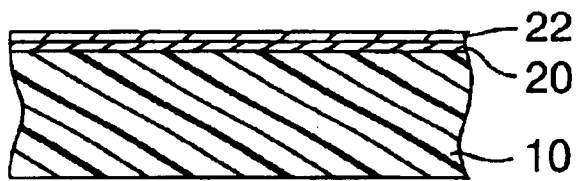
FIG. 4 is a diagram for explaining the first half of the process sequence in a first example of the fabrication process for the multi-layer double-sided wiring board of the present invention.
Figure 4B:
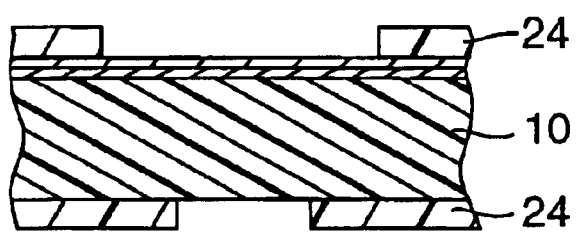
Figure 4C:
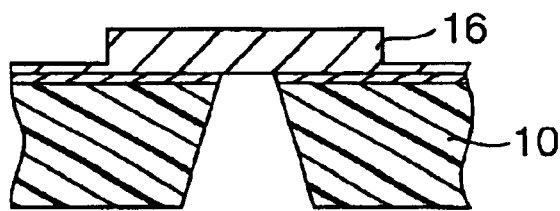
Figure 4D:
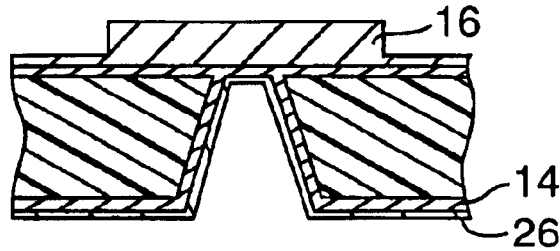
Figure 4E:
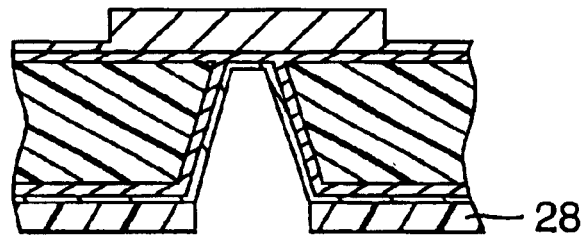
Figure 5A:
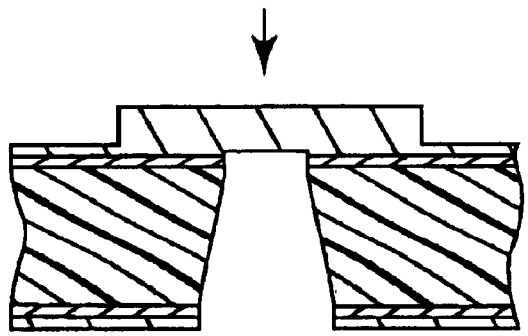
FIG. 5 is a diagram for explaining the second half of the process sequence in the first example of the fabrication process for the multi-layer double-sided wiring board of the present invention.
Figure 5B:
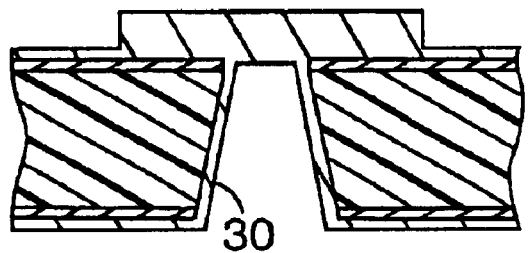
Figure 5C:
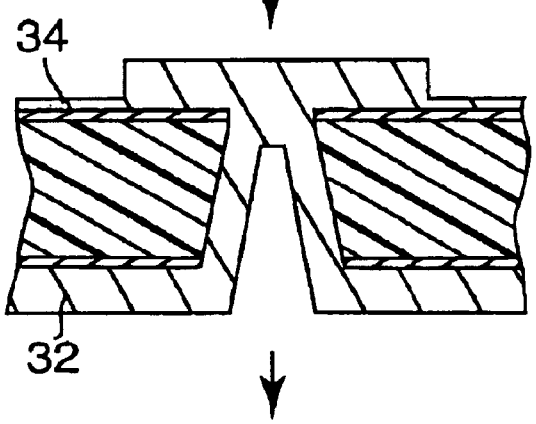
Figure 5D:
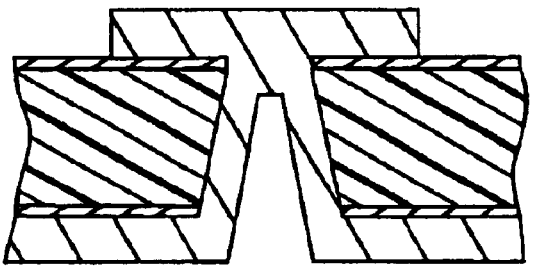
Figure 6A:
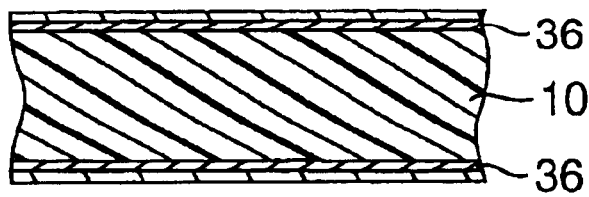
FIG. 6 is a diagram for explaining a second example of the fabrication process for the multi-layer double-sided wiring board of the present invention.
Figure 6B:
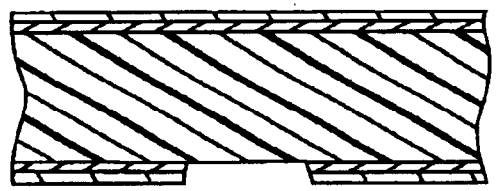
Figure 6C:
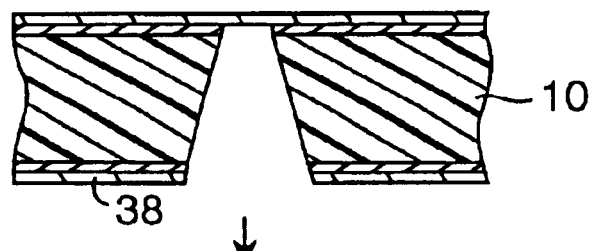
Figure 6D:
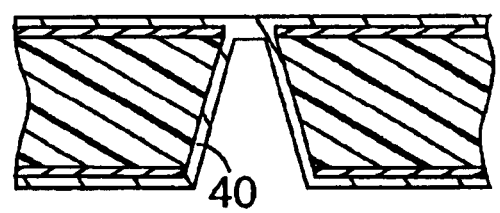
Figure 6E:
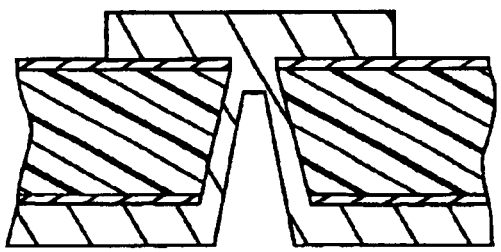

10 . . . insulating layer
12, 16 . . . conductive layer
14 . . . interface layer
18 . . . blind via

What is claimed is:

1. A multi-layer double-sided wiring board comprising:
an insulating layer having an opening formed therein;
a first conductive layer formed on an upper surface of the insulating layer;
a second conductive layer formed on a lower surface of the insulating layer and covering an inside wall of the opening and a portion of the first conductive layer which is exposed in the opening; and
an interface layer interposed between the insulating layer and at least a portion of one or both of the first and second conductive layers including the portion of the second conductive layer covering an inside wall of the opening, and wherein
the first and second conductive layers are materials having the same conductivity,
the interface layer contains a material different from the materials of the first and second conductive layers, and
the second conductive layer directly contacts the first conductive layer in the portion of the opening adjacent the upper surface of the insulating layer without the interface layer being interposed therebetween.

2. A multi-layer double-sided wiring board according to claim 1, wherein the interface layer contains at least one metallic element selected from the group consisting of nickel, cobalt, zinc, and chromium.

3. A multi-layer double-sided wiring board according to claim 1, wherein the first and second conductive layers are made of the same material.

4. A multi-layer double-sided wiring board according to claim 1, wherein the first and second conductive layers are made of copper.

5. A method of fabricating a multi-layer double-sided wiring board, comprising the steps of:
selectively removing a portion of an insulating layer on an upper surface of which is formed a conductive layer, and thereby forming in the insulating layer an opening whose upper end is closed with the conductive layer;
forming an interface layer over an entire lower surface;
selectively removing at least a portion of the interface layer which contacts the first conductive layer; and
forming a conductive layer over the entire lower surface.

\* \* \* \* \*

UNITED STATES PATENT AND TRADEMARK OFFICE
CERTIFICATE OF CORRECTION

PATENT NO. : 6,803,528 B1
DATED : October 12, 2004
INVENTOR(S) : Koyanagi, Tatsunori It is certified that error appears in the above-identified patent and that said Letters Patent is hereby corrected as shown below:

Column 1,
Line 51, after "lead" insert -- in the --.

Column 4,
Line 2, after "50 $\mu$m" insert -- , --.
Line 15, delete "arm" and insert -- are -- therefor.

Column 5,
Line 11, delete "110" and insert -- 10 -- therefor.

Signed and Sealed this

Tenth Day of May, 2005

JON W. DUDAS
*Director of the United States Patent and Trademark Office*